United States Patent [19]

Hayafuji et al.

[11] Patent Number: 5,677,922
[45] Date of Patent: Oct. 14, 1997

[54] SEMICONDUCTOR LASER WITH CRYSTALLINE WINDOW LAYER

[75] Inventors: Norio Hayafuji; Takashi Motoda, both of Itami, Japan

[73] Assignee: Mitsubishi Denki Kabushiki Kaisha, Tokyo, Japan

[21] Appl. No.: 589,462

[22] Filed: Jan. 22, 1996

[30] Foreign Application Priority Data

May 8, 1995 [JP] Japan ..................... 7-109567

[51] Int. Cl.$^6$ ..................................................... H01S 3/19
[52] U.S. Cl. .............................................. 372/49; 372/46
[58] Field of Search ........................................ 372/49, 46

[56] References Cited

U.S. PATENT DOCUMENTS

| | | | |
|---|---|---|---|
| 4,122,407 | 10/1978 | Van Vechten | 372/44 |
| 5,228,047 | 7/1993 | Matsumoto et al. | 372/49 |
| 5,294,815 | 3/1994 | Iechi | 257/95 |
| 5,357,123 | 10/1994 | Sugawara | 372/49 |

FOREIGN PATENT DOCUMENTS

| | | |
|---|---|---|
| 0475618 | 9/1990 | European Pat. Off. |
| 0469900 | 2/1992 | European Pat. Off. |
| 0475618 | 3/1992 | European Pat. Off. |
| 56-083034 | 7/1981 | Japan . |
| 57-012562 | 1/1982 | Japan . |
| 60-57990 | 4/1985 | Japan . |
| 2159082 | 6/1990 | Japan . |
| 4116880 | 4/1992 | Japan . |
| 6045689 | 2/1994 | Japan . |

OTHER PUBLICATIONS

Wada et al, "A New Chemical Etching Technique for Formation of Cavity Facets of GaAlAs Lasers", IEEE Journal of Quantum Electronics, vol. QE–21, No. 6, pp. 658–662 Jun. 1985.

Wada et al., "A New Chemical Etching Technique for Formation of Cavity Facets of (GaAl)As Lasers", IEEE Journal of Quantum Electronics, vol. QE–21, No. 6, Jun. 1985, pp. 658–662.

Suematsu et al., "Handbook of Semiconductor Lasers and Photonic Integrated Circuits", Chapman & Hall, London, 1994, pp. 317–319. (No Month).

Primary Examiner—Rodney B. Bovernick
Assistant Examiner—Luong-Quyen T. Phan
Attorney, Agent, or Firm—Leydig, Voit & Mayer, Ltd.

[57] ABSTRACT

A semiconductor laser according to the invention includes a compound semiconductor substrate having a surface with a first crystalline orientation; crystalline semiconductor layers including a first cladding layer, an active layer, and a second cladding layer successively disposed on the surface of the semiconductor substrate and including first and second window surfaces transverse to the surface of the semiconductor substrate and having a second crystalline orientation; a doped crystalline semiconductor window layer disposed on the window surfaces; and electrodes respectively disposed on the crystalline layers and the semiconductor substrate.

12 Claims, 9 Drawing Sheets

SURFACE B
{111}A

SEMICONDUCTOR LASER WITH CRYSTALLINE WINDOW LAYER

FIELD OF THE INVENTION

This invention relates to a semiconductor laser that produces high power light output and a method of manufacturing the semiconductor laser.

DESCRIPTION OF RELATED ART

It has become possible to prepare a variety of mixed compound crystalline materials with good controllability thanks to crystal growing methods developed in recent years, especially the metal organic chemical vapor deposition (MOCVD) method. This development has led to rapid progress in the field of semiconductor lasers. A semiconductor laser producing visible light and that employs crystalline AlGaInP, in particular, has already been put into practical use in generating light at wavelengths of 680 nanometers (nm) and 670 nm. The most significant challenges are to achieve still shorter wavelength light generation and higher power light output.

An obstacle to higher power output is catastrophic optical damage (COD) at the window of the laser through which the laser light is emitted. The threshold power density for COD is low, namely, under two $MW/cm^2$. There have been reports of various measures for solving this problem. For example, in GC-3 of the Spring 1991 National Convention, Electronic Communication Society, and in the *Japanese Journal of Applied Physics*, Volume 29, Number 9, September 1990, pages L-1666 to L-1668, there are reports of creating a window structure in which zinc (Zn) is diffused into the vicinity of a window at the end surface of a laser and through which laser light is emitted. According to these publications and as well known in the art, when the undoped GaInP active layer of the semiconductor laser is grown under appropriate conditions, it includes a natural superlattice structure. Although this active layer is essentially compositionally homogeneous, it actually includes a periodically ordered structure that exhibits a band gap energy lower than the band gap energy of the same material in the absence of the natural superlattice. According to these publications, a dopant, specifically Zn, is diffused into the active layer and adjacent regions of the semiconductor laser at each facet. The introduction of the dopant impurity causes disordering of the natural superlattice, just as similar doping is known to disorder superlattice structures including alternating layers of different materials arranged periodically. An increase of 70 meV in the band gap energy of the natural superlattice layer disordered by the introduction of Zn was reported. As well known, the increased band gap energy reduces the quantity of light absorbed at the facet, enabling an increase in power output without increasing the temperature at the facets.

Figure 6A:
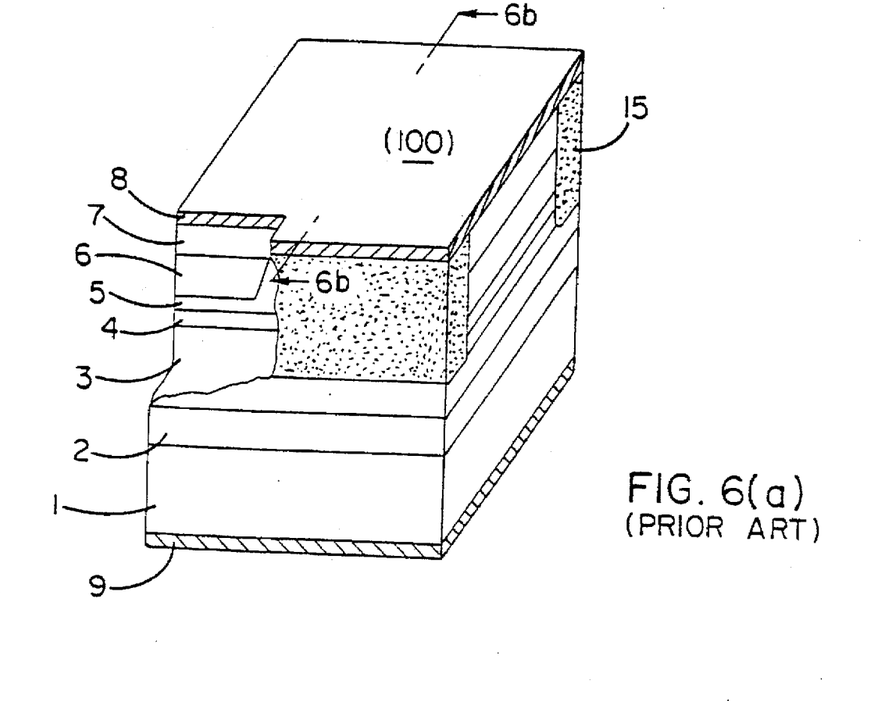
FIGS. 6(a) and 6(b) are, respectively, a perspective view, partially cut away, and a cross-sectional view, taken along line 6b—6b of FIG. 6(a), of a conventional semiconductor laser.
Figure 6B:
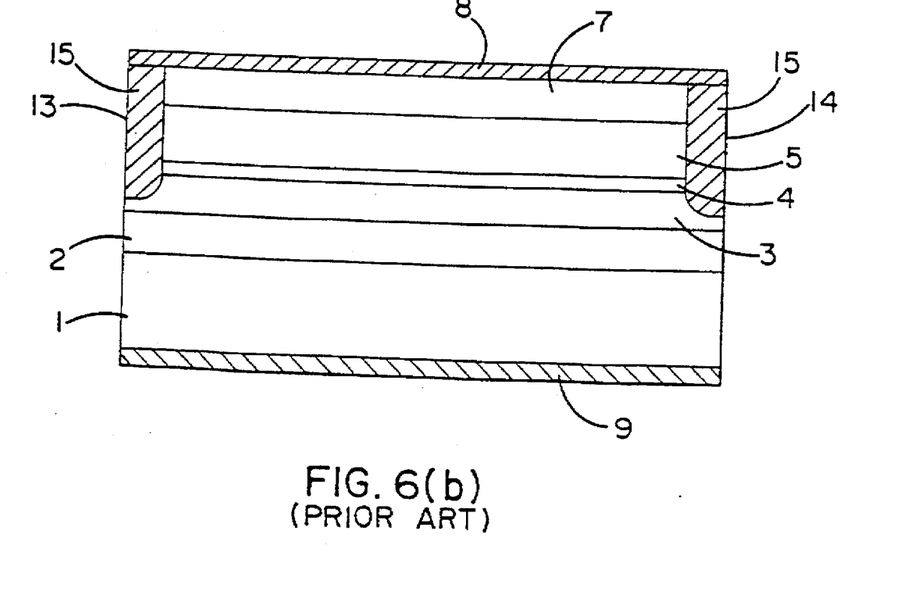
Figure 7A:
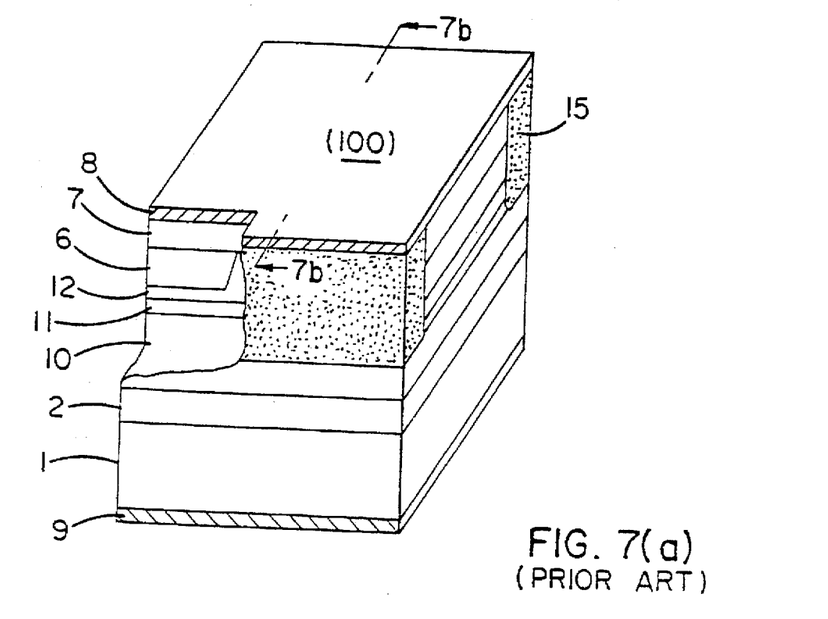
FIGS. 7(a) and 7(b) are, respectively, a perspective view, partially cut away, and a cross-sectional view, taken along line 7b—7b of FIG. 7(a), of a conventional semiconductor laser.
Figure 7B:
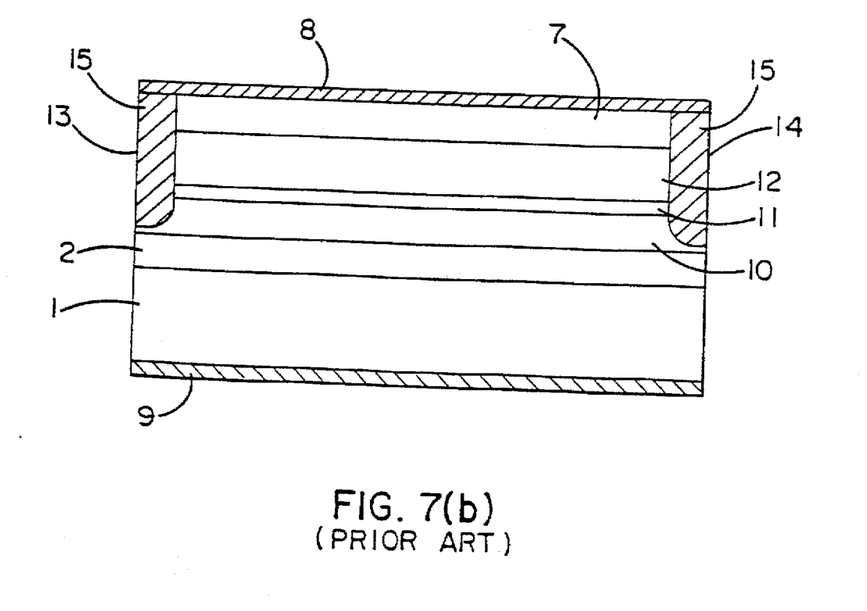

FIGS. 6(a) and 7(a) are perspective views, partially cut away, and FIGS. 6(b) and 7(b) are respective cross-sectional views of semiconductor lasers including Zn-diffused window regions. FIGS. 8(a)–8(d) are perspective views illustrating a method for manufacturing the semiconductor lasers of FIGS. 6(a) and 7(a).

The AlGaAs semiconductor laser of FIGS. 6(a) and 6(b) includes an n-type GaAs substrate 1, an n-type GaAs buffer layer 2, an n-type AlGaAs lower cladding layer 3, a GaAs active layer 4, a p-type AlGaAs upper cladding layer 5, an n-type GaAs current blocking layer 6, a p-type GaAs contact layer 7, a p electrode 8, an n electrode 9, a front surface 13 including a window through which laser light is emitted, a rear surface 14, and Zn-diffused regions 15.

FIGS. 7(a) and 7(b) show an AlGaInP semiconductor laser device in which the same reference numbers as in FIGS. 6(a) and 6(b) denote the same or equivalent elements. Those elements previously described are not described again. In FIGS. 7(a) and 7(b), the AlGaInP semiconductor laser includes an n-type AlGaInP lower cladding layer 10, a GaInP active layer 11, and a p-type AlGaInP upper cladding layer 12.

Figure 8A:
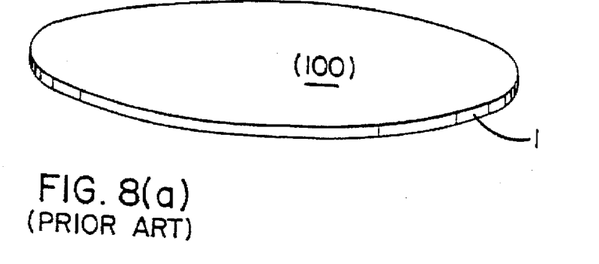
FIGS. 8(a)–8(d) are perspective views illustrating a method of manufacturing a conventional semiconductor laser.
Figures 8B, 8C, 8D:
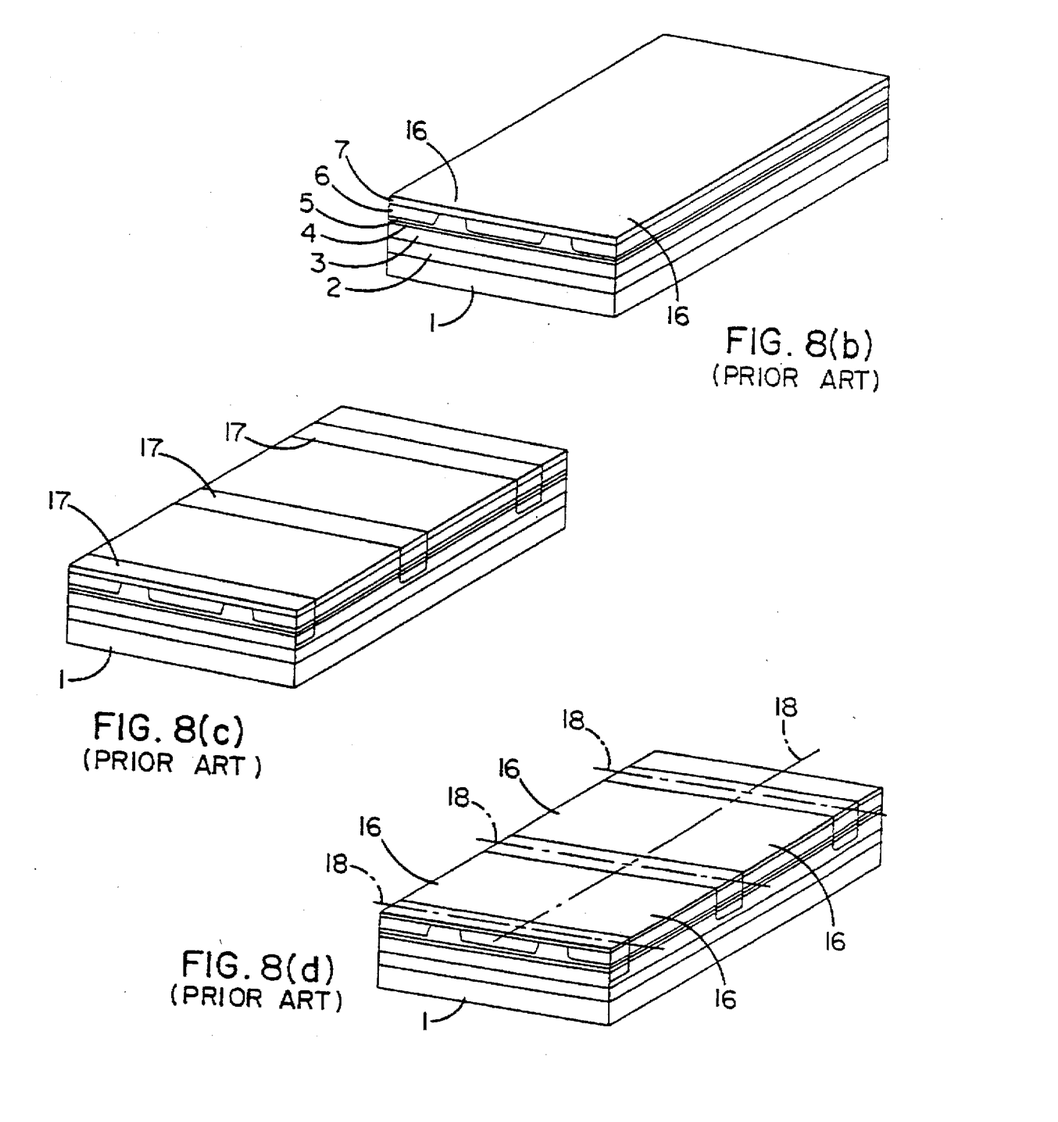

To manufacture the semiconductor lasers shown in FIGS. 6(a) and 7(a), an n-type GaAs wafer 1 that has a surface with a (100) crystalline orientation, as shown in FIG. 8(a), is used. First, as shown in FIG. 8 (b), the buffer layer 2, the lower cladding layer 3, the active layer 4, and the upper cladding layer 5 are successively grown on the substrate 1 by MOCVD. Then, the upper cladding layer 5 is partially etched and removed to form a mesa between two grooves. The grooves are filled by growing the current blocking layer 6 by MOCVD. Further, the contact layer 7 is also grown by MOCVD to produce a plurality of laser devices 16.

As shown in FIG. 8(c), Zn is diffused into the window region to produce Zn-diffused regions 17 and then the substrate 1, including a plurality of lasers 16, is cleaved along cleavage lines 18 to produce a plurality of individual lasers 16. Each laser 16 is then provided with the n electrode 8 and the p electrode 9 to complete the semiconductor laser illustrated in FIG. 6(a).

The semiconductor laser shown in FIG. 7(a) is manufactured by growing the buffer layer 2 by MOCVD as in FIGS. 8(a) and 8(b). The lower cladding layer, the active layer, and the upper cladding layer are successively grown by MOCVD. These grown layers are then subjected to the manufacturing steps illustrated and described above with respect to FIGS. 8(c) and 8(d).

In the conventional semiconductor laser, since the window region 15 is formed by diffusing Zn, the controllability of the size and location of the window region 15 is poor due to variations in the Zn concentration gradient and in the thickness of the layers. In addition, since the substrate 1 including a plurality of laser devices 16 is cleaved along the Zn-diffused region 17 to form laser facets, the controllability of the configuration of the cleaved surfaces is poor, so that a good window structure cannot be obtained.

In one alternative, the Zn-diffused window region may be formed after the plurality of lasers shown in FIG. 8(b) are divided into individual lasers 16. This method, however, has a drawback in that the diffusion of Zn is extremely difficult and the controllability of location and size of the window region 15 is still poor due to variations in the Zn concentration gradient and in layer thickness, thus preventing the production of a good window structure.

SUMMARY OF THE INVENTION

It is an object of the invention to provide a semiconductor laser and a method of manufacturing the semiconductor laser including a window structure that is easily controlled and that can be produced while the laser is still in a wafer state.

Other objects and advantages of this invention will become apparent from the detailed description that follows. It should be understood, however, that the detailed description and specific embodiments are provided for illustration only since various additions and modifications within the spirit of the invention will become apparent to those skilled in the art from this disclosure.

According to a first aspect of the invention, a semiconductor laser includes a compound semiconductor substrate having a surface with a first crystalline orientation; crystalline semiconductor layers including a first cladding layer, an active layer, and a second cladding layer successively disposed on the surface of the semiconductor substrate and including first and second window surfaces transverse to the surface of the semiconductor substrate and having a second crystalline orientation; a doped crystalline semiconductor window layer disposed on the window surfaces; and electrodes respectively disposed on the crystalline layers and the semiconductor substrate.

According to a second aspect of the invention, a multiple beam semiconductor laser device includes a compound semiconductor substrate having a surface with a first crystalline orientation; crystalline semiconductor layers including a first cladding layer, an active layer, and a second cladding layer successively disposed on the surface of the semiconductor substrate, including first and second window surfaces transverse to the surface of the semiconductor substrate and having a second crystalline orientation, and a plurality of grooves transverse to the semiconductor substrate surface and to the window surfaces whereby multiple semiconductor lasers are formed; a doped crystalline semiconductor window layer disposed on the window surfaces; and electrodes disposed on the respective semiconductor lasers and on the semiconductor substrate.

According to a third aspect of the invention, a method of manufacturing a semiconductor laser includes successively growing on a surface of a compound semiconductor wafer having a first crystalline orientation a first cladding layer, an active layer, and a second cladding layer; forming a first protective layer on the grown layers, the first protective layer including a plurality of grooves extending along a first crystalline direction and exposing the grown layers; etching the grown crystalline layers in the grooves using a first etchant that etches the grown layers on a surface having a second crystalline orientation substantially perpendicular to the first crystalline orientation much slower than on surfaces having a different crystalline orientation; forming a second protective layer on the surface having the second crystalline orientation and on part of another surface exposed by the first etchant; isotropically etching the part of the grown layers not covered by the second protective layer with a second etchant and, subsequently, with the first etchant to produce a second surface having the second crystalline orientation; and removing the first and second protective layers and growing a doped crystalline window layer covering at least one of the surfaces having the second crystalline orientation.

According to a fourth aspect of the invention, a method of manufacturing a multiple beam semiconductor laser device includes successively growing on a surface of a compound semiconductor wafer having a first crystalline orientation a first cladding layer, an active layer, and a second cladding layer; forming a first protective layer on the grown layers, the first protective layer including a plurality of grooves extending along first and second orthogonal crystalline directions and exposing the grown layers; etching the grown crystalline layers in the grooves using a first etchant that etches the grown layers on a surface having a second crystalline orientation substantially perpendicular to the first crystalline orientation much slower than on surfaces having a different crystalline orientation; forming a second protective layer on the surface having the second crystalline orientation and on part of another surface exposed by the first etchant; isotropically etching the part of the grown layers not covered by the second protective layer with a second etchant and, subsequently, with the first etchant to produce a second surface having the second crystalline orientation; and removing the first and second protective layers and growing a doped crystalline window layer covering at least one of the surfaces having the second crystalline orientation.

BRIEF DESCRIPTION OF THE DRAWINGS

In all figures, the same elements are given the same reference numbers.

DESCRIPTION OF THE PREFERRED EMBODIMENTS

Embodiment 1

Figure 1A:
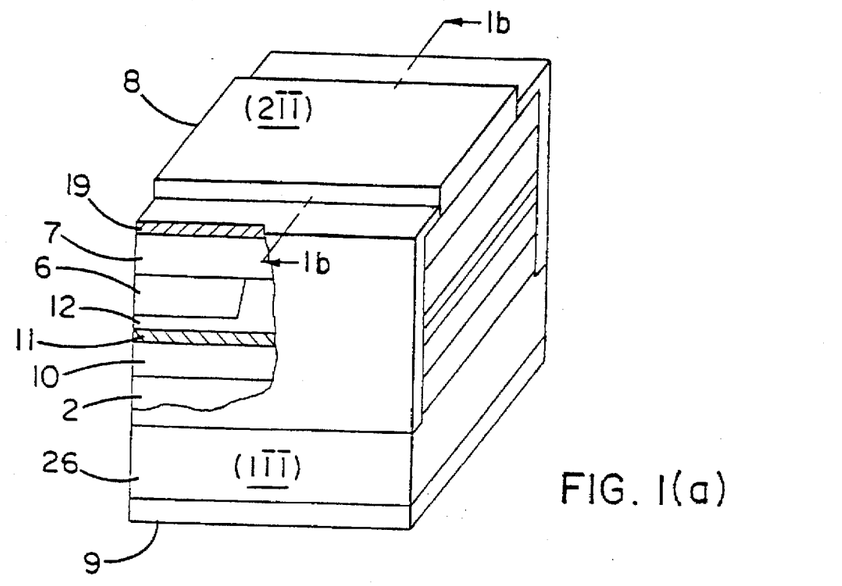
FIGS. 1(a) and 1(b) are, respectively, a perspective view, partially broken away, and a cross-sectional view, taken along line 1b—1b of FIG. 1(a), of a semiconductor laser according to an embodiment of the invention.
Figure 1B:
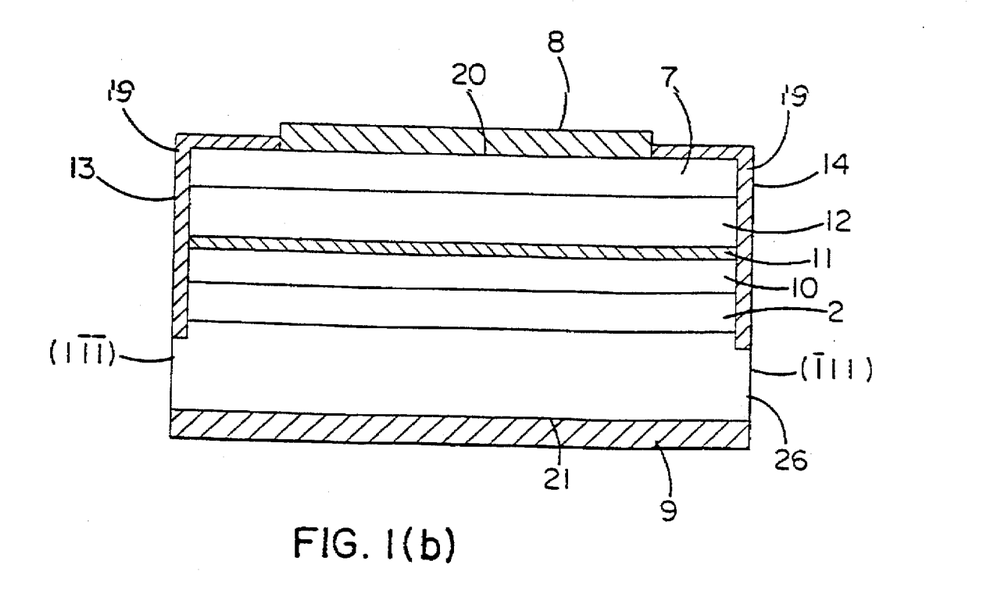

FIGS. 1(a) and 1(b) are, respectively, a perspective view, partially broken away, and a cross-sectional view taken along line 1b—1b of FIG. 1(a). FIGS. 1(a) and 1(b) depict an AlGaInP semiconductor laser emitting red light according to an embodiment of the invention. That semiconductor laser includes an n-type GaAs substrate 26 having a surface lying in a {211} plane, such as a (211) surface, and a surface 21 opposite the (211) surface. The semiconductor laser includes, successively disposed on the {211} plane of the substrate 26, an n-type GaAs buffer layer 2, an n-type AlGaInP lower cladding layer 10, a GaInP or AlGaInP active layer 11, and a p-type AlGaInP upper cladding layer 12. The semiconductor laser also includes an n-type GaAs current blocking layer 6, a p-type GaAs contact layer 7, and respective p and n electrodes 8 and 9. The laser light is emitted through a front surface 13 that is opposite a rear surface 14 of the semiconductor laser. The GaInP or AlGaInP active layer 11 is grown under conditions that produce a natural superlattice within the active layer. The existence of a natural superlattice within these materials, depending upon growth conditions, is a well known phenomenon.

A Zn-doped p$^+$-type AlGaInP or p$^+$-type AlGaAs window layer 19 covers the grown layers at the front and rear surfaces 13 and 14 of the semiconductor laser. Those surfaces lie in $\{1\bar{1}\bar{1}\}$ planes. The window layer 19 also covers parts of the contact layer 7 on an upper surface 20 opposite the substrate 26. As described in greater detail below, during the growth of the heavily Zn-doped window layer 19, some of the Zn diffuses into the active layer 11 at the front and rear surfaces 13 and 14, thereby disordering regions of the natural superlattice of the active layer 11, increasing its band gap energy. In addition, preferably, the composition of the window layer 19 is controlled so that layer 19 has a larger band gap energy than at least the active layer 11 to reduce the absorption of light at the front and rear surfaces 13 and 14 of the semiconductor laser. These features permit an increase in the output power without risk of COD since the amount of absorbed light, which raises the temperature of the facets, is reduced.

The specified crystalline surface orientations mean that the front and rear surfaces 13 and 14 are each in one of the $\{1\bar{1}\bar{1}\}$ planes, for example, and $(\bar{1}11)$. The surface of the substrate 26 on which the semiconductor layers are sequentially disposed may be the (211) surface in which case the orientation of the surface 21 is $(\bar{2}\bar{1}\bar{1})$. These crystalline orientations require the front and rear surfaces to be perpendicular to the surfaces of the substrate.

Figure 2A:
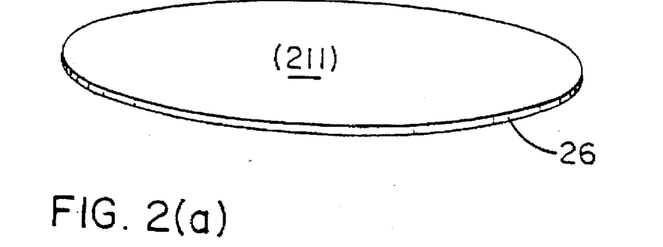
FIGS. 2(a)–2(c) are perspective views and FIGS. 2(d)–2(k) are cross-sectional views taken along line 2—2 of FIG. 2(c) and illustrating a method of manufacturing a semiconductor laser according to an embodiment of the invention.
Figure 2B:
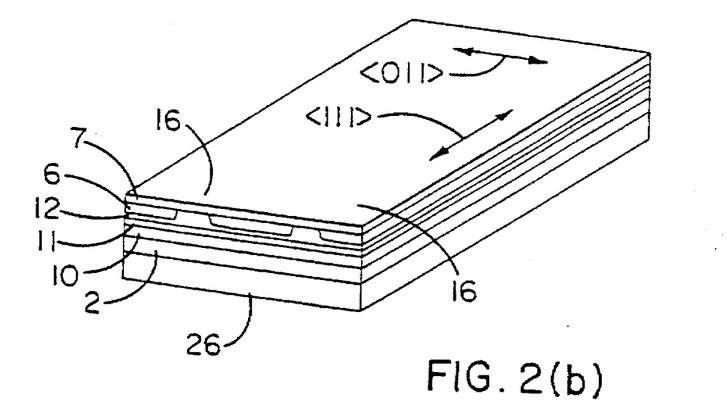
Figure 2C:
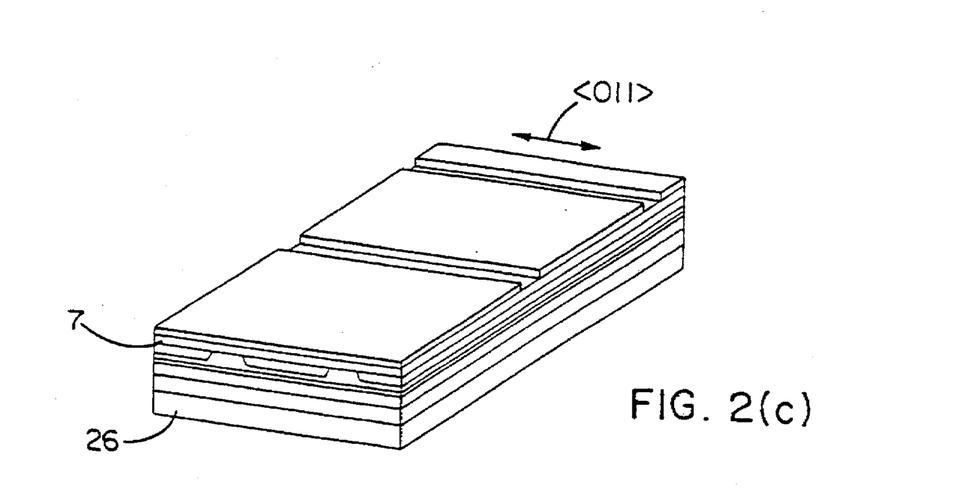

A method of manufacturing the semiconductor laser of FIG. 1(a) is illustrated in FIGS. 2(a)–2(k) in which FIGS. 2(d)–2(k) are cross-sectional views taken along the line 2—2 in FIG. 2(c). Initially, as shown in FIG. 2(a), a GaAs wafer 26 having opposed surfaces in {211} planes is prepared. On one of the surfaces, which may be a (211) surface, there are sequentially grown by MOCVD the n-type GaAs buffer layer 2, the n-type AlGaInP lower cladding layer 10, the active layer 11, and the p-type AlGaInP upper cladding layer 12, as shown in FIG. 2(b). Part of the upper cladding layer 12 is removed by etching, leaving a mesa extending in a <111> direction. In a second growth step, the grooves on each side of each mesa are filled by growing the n-type GaAs current blocking layer 6, following which the p-type GaAs contact layer 7 is grown, completing the growth steps in producing a plurality of semiconductor laser structures on the substrate 26, as in FIG. 2(b).

Figure 2D:
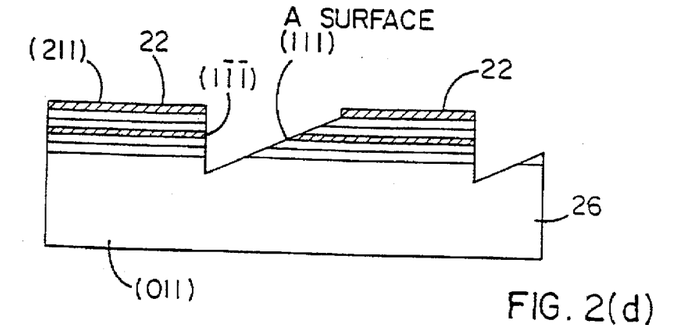

In the next step, as illustrated in FIG. 2(c), an etching protective layer 22, for example, $Si_3N_4$, including a plurality of strips separated by grooves extending in a <011> direction is formed on the contact layer 7. The grooves in the etching protective layer 22 expose parts of the crystalline semiconductor layers grown in the previous steps. Those layers are etched through the grooves using an etchant, for example, a mixture of sulfuric acid, hydrogen peroxide, and water, that has an extremely slow etching speed on {111} planes, particularly the A faces of {111} planes, such as $(1\bar{1}\bar{1})$A and (111)A surfaces. Because of that etching characteristic, the etching process is self-limiting and essentially stops when a {111}A plane is exposed. The angle between (211) and (1$\bar{1}\bar{1}$) surfaces is 90° because the inner product of their Miller indices is zero. This result means that a $(1\bar{1}\bar{1})$ surface that can be used as a window is formed in the first etching process as an extremely smooth surface that is perpendicular to the surface of the substrate 26. This result is shown in FIG. 2(d) where the etching has proceeded to a self-limiting condition, penetrating into part of the substrate 26.

Figure 2E:
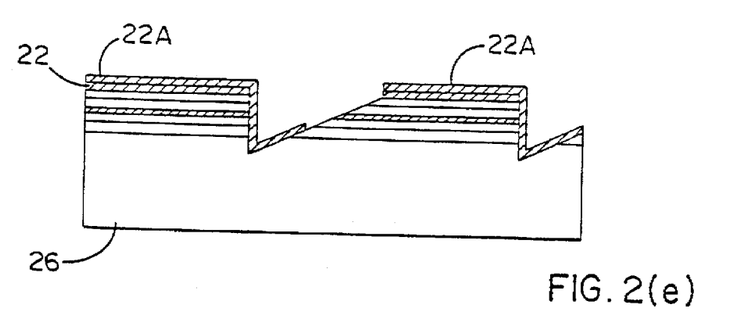
Figure 2F:
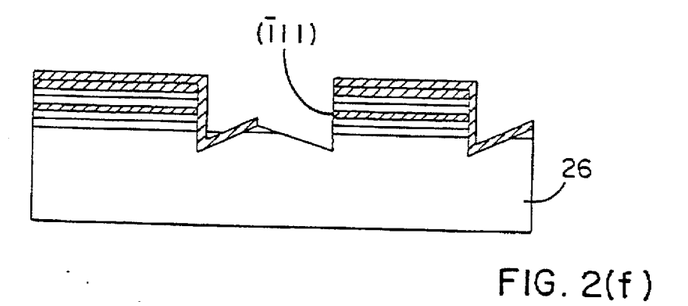

Next, an etching protective layer 22A is formed on the entire $(1\bar{1}\bar{1})$ surface extending from that surface to nearly the middle of the oblique etched surface, as shown in FIG. 2(e). Then, the portion of the grown layers not covered by either of the protective layers 22 and 22A is subjected to a second wet etching process. The second wet etching process includes two steps. In the first step, the exposed surfaces are etched using a mixture of bromine and methanol, which etches the crystalline semiconductor layers isotropically. In the second of the two steps, the same etchant as previously used, for example, a mixture of sulfuric acid, hydrogen peroxide, and water, is used to expose a {Ill}B plane, for example, a $(\bar{1}11)$ surface. Again, this anisotropic etching is self-limiting, resulting in the production of a $(\bar{1}11)$ surface that is extremely smooth and perpendicular to the (211) surface of the substrate 26 and directly opposite and parallel to the $(1\bar{1}\bar{1}11)$ surface exposed in the first etching process illustrated in FIG. 2(d). The resulting structure appears in FIG. 2(f).

Figure 2G:
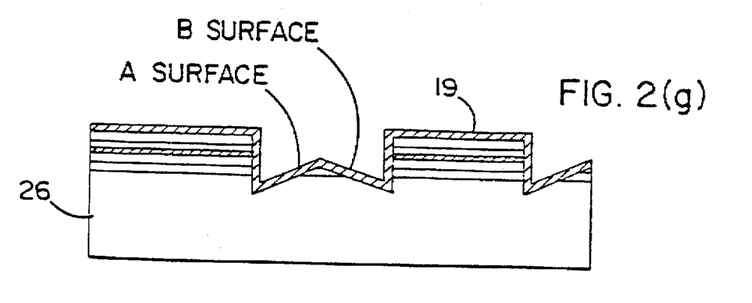
Figure 2H:
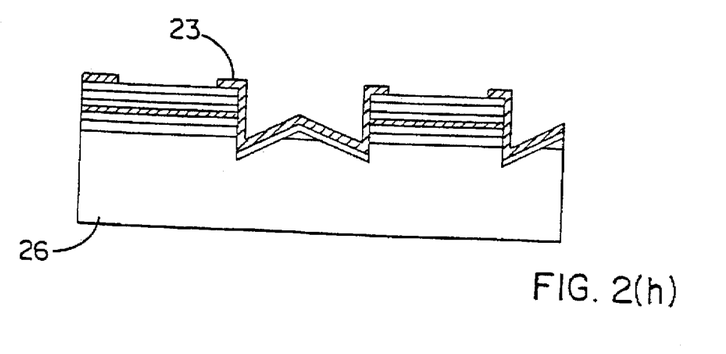
Figure 2I:
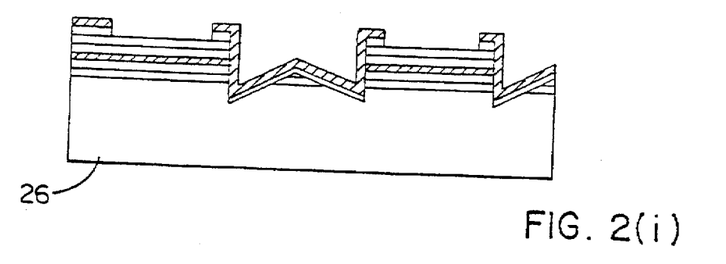

After these etching processes, the protective layers 22 and 22A are removed and the $p^+$-type window layer 19 of AlGaInP or AlGaAs is grown by MOCVD, as illustrated in FIG. 2(g). An electrode formation protective layer 23, for example, of $Si_3N_4$, is formed, as shown in FIG. 2(h), and the window layer 19 is selectively removed to expose parts of the contact layer 7 for formation of electrodes, as shown in FIG. 2(i). Although in the structure shown in these figures the window layer 19 is disposed on both the front and rear surfaces, a semiconductor laser according to the invention may include the window layer 19 on only one of these surfaces. The growth of the window layer 19 by MOCVD permits easy control of the thickness and composition of that window layer 19, providing a semiconductor laser of improved structure and performance.

During the growth of the window layer 19 by MOCVD at an elevated temperature, some of the dopant impurity contained within that $p^+$-type layer, for example, Zn, diffuses into the adjacent portions of the laser structure including the active layer 11. Since the location and extent of the window layer 19 are controlled by a growth mask, the location and extent of the regions into which the dopant impurity diffuses during the growth process is predictable and easily controlled, leading to improved uniformity and production yield. The active layer 11 includes a natural superlattice and the entry of the Zn disorders the natural superlattice, increasing the band gap energy of the region containing the Zn, reducing light absorption and increasing the power of the light that the semiconductor laser can produce without risk of COD.

Figure 2J:
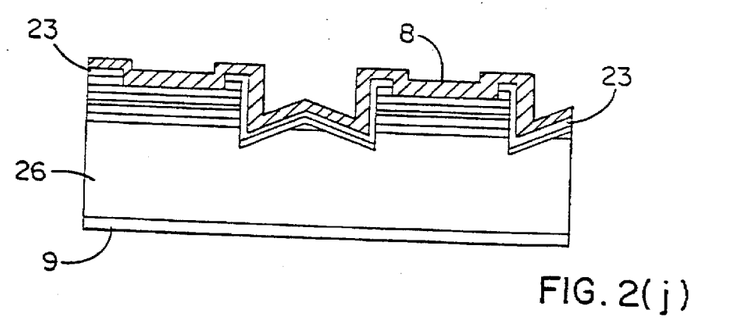
Figure 2K:
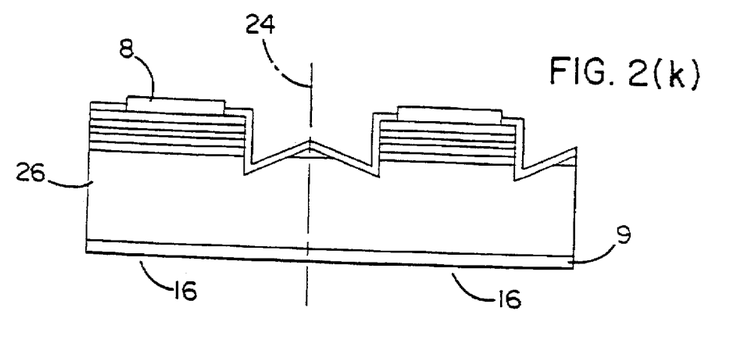

A semiconductor laser structure according to the invention is completed, as shown in FIG. 2(j), by forming the p electrode 8 on the grown layers and the n electrode 9 on the rear surface 21 of the substrate 26. Using the lift-off technique, by removing the protective layer 23, unneeded portions of the layers from which the p electrodes 8 are formed are removed, producing the structure of FIG. 2(k). That structure is cleaved, essentially only in the substrate 26, in the <111> direction along a cleavage line 24 in a <011> direction, as shown in FIG. 2(k), to produce individual semiconductor lasers. The front and rear surfaces of those lasers are not produced in the cleaving process but were earlier produced by etching and are substantially covered by the window layer 19.

The risk of COD is substantially reduced in the semiconductor laser according to the first embodiment. Light absorption is decreased by disordering of the active layer 11 adjacent the front and rear surfaces because of the diffusion of a dopant impurity from the heavily doped window layer 19 into the active layer 11. In addition, preferably, the window layer 19 has a higher band gap energy than the active layer 11 so that there is less light absorption in the semiconductor laser than when the window layer 19 is absent. Because of these effects, a higher light density can be output from a semiconductor laser according to the invention than from a semiconductor laser according to the prior art at the same temperature of the laser facets.

Although the specific semiconductor laser embodiment described includes an essentially homogeneous active layer including a natural superlattice, the invention can also be applied to a semiconductor laser including an active layer having a multiple quantum well structure produced by alternatingly laminating thin layers of different semiconductor materials having different band gap energies. Therefore, the term superlattice as used in this application refers both to a natural superlattice as well as a superlattice produced by alternatingly laminating layers of semiconductor materials having different band gap energies.

Embodiment 2

Figure 3A:
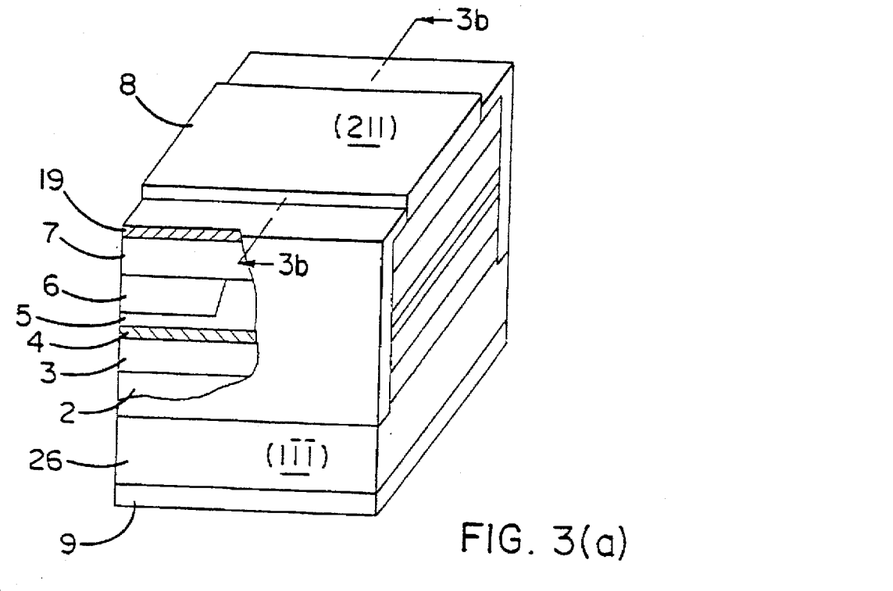
FIGS. 3(a) and 3(b) are, respectively, a perspective view, partially broken away, and a cross-sectional view, taken along line 3b—3b of FIG. 3(a), of a semiconductor laser according to an embodiment of the invention.
Figure 3B:
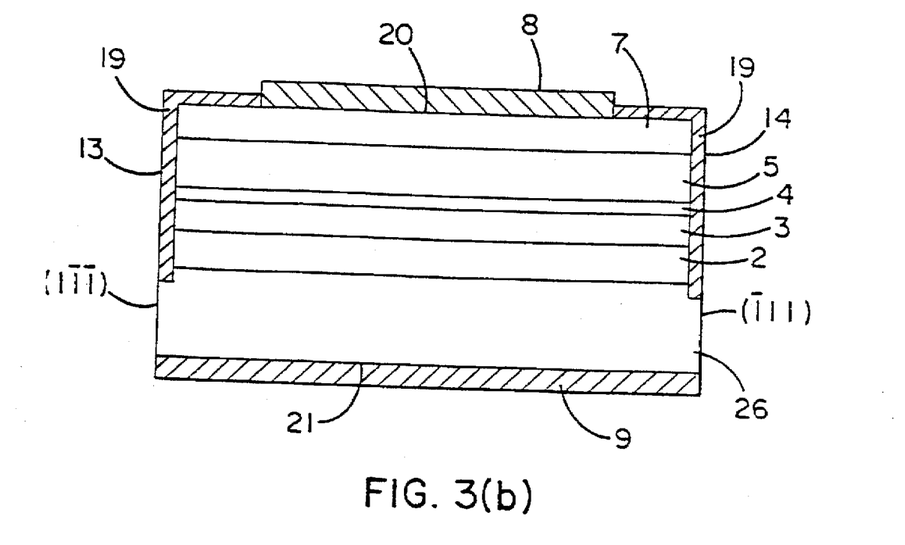

The semiconductor laser described with respect to FIG. 1(a) includes an AlGaInP active layer and produces red light. However, other materials may be used in semiconductor lasers according to the invention. FIGS. 3(a) and 3(b) are, respectively, a perspective view, partially cut away, and a cross-sectional view taken along line 3b—3b of FIG. 3(a) of a semiconductor laser according to another embodiment of the invention. In this embodiment, the active layer 4 is AlGaAs and the laser emits infrared light. In FIGS. 3(a) and 3(b), the same reference numbers are used as used in FIGS. 1(a) and 1(b) to denote the same elements and repeated description of those common elements is omitted. In the semiconductor laser of FIGS. 3(a) and 3(b), the lower cladding layer 3 is n-type AlGaAs, the active layer 4 is GaAs or AlGaAs, and the upper cladding layer 5 is p-type AlGaAs.

The semiconductor laser shown in FIGS. 3(a) and 3(b) is manufactured using the same steps and the general method described with respect to FIGS. 2(a)–2(k). The process is different only in the materials that are grown by MOCVD for the cladding layer and the active layer.

The same advantages are achieved in this embodiment of the invention as in the first embodiment. The Zn diffusion into the active layer and adjacent regions is easily controlled in location and extent because the window layer 19 functions as a source of a dopant for the diffusion. In addition, the window layer 19, having a larger band gap energy than the active layer 11, functions as a laser facet, absorbing less light than is absorbed by the active layer and the upper and lower cladding layers in the absence of the window layer.

Embodiment 3

Figure 4:
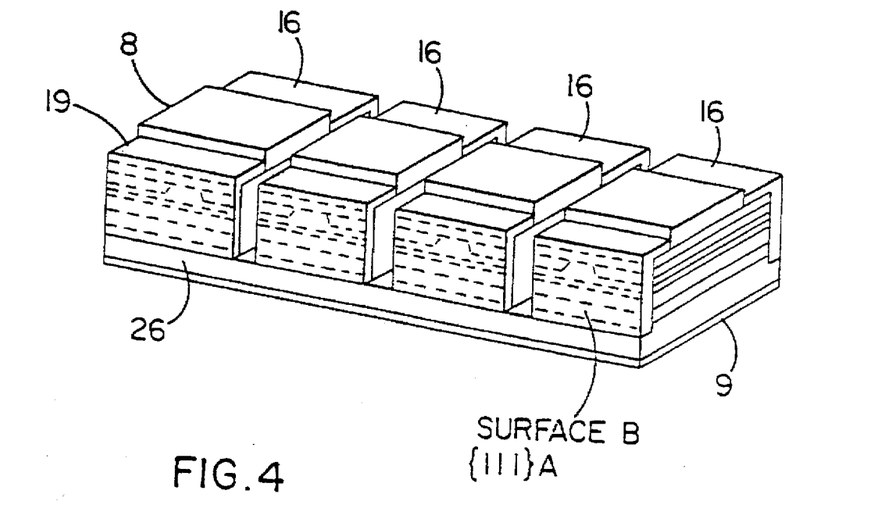
FIG. 4 is a perspective view of a multiple beam semiconductor laser device according to an embodiment of the invention.

FIG. 4 is a perspective view of another embodiment of the invention, namely, a multiple beam semiconductor laser device. As illustrated in FIG. 4, a plurality of semiconductor lasers are disposed on the common n-type GaAs substrate 26 having a (211) surface. The front surface 13 of each laser of the device is either an A or B face of a {111} plane perpendicular to the {211} plane of the semiconductor laser on which the electrodes 8 are disposed.

Figure 5:
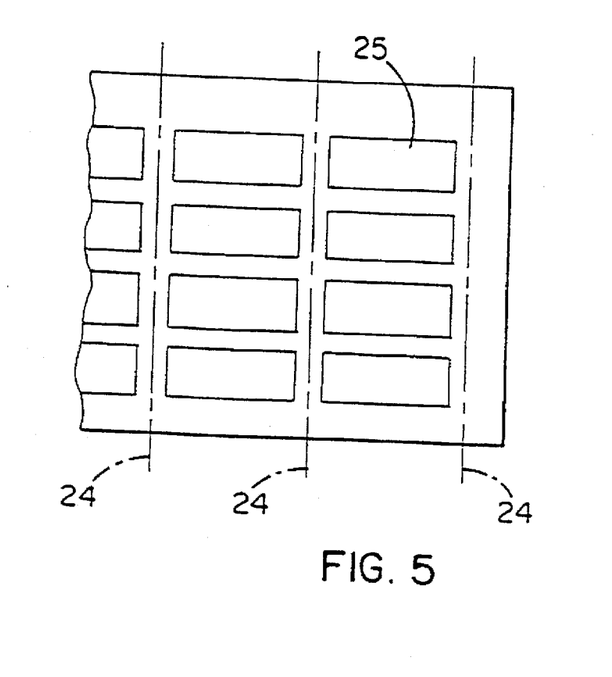
FIG. 5 is a plan view illustrating a method of manufacturing the semiconductor laser device embodiment of FIG. 4.

In order to manufacture the multiple beam semiconductor laser device shown in FIG. 4, in the step of FIG. 2(c), the etching protective layer 22 is formed to include two sets of orthogonal grooves exposing the grown layers. Thus, the etching protective layer comprises rectangular etching protective regions 25, as illustrated in FIG. 5. One set of grooves is oriented along a <011> direction as are the grooves in FIG. 2(c). After the formation of the etching protective layer regions 25, the same processing as illustrated in FIGS. 2(d)–2(j) is carried out. Contrary to FIG. 2(k), the final cleaving step is performed along cleavage lines 24, shown in FIG. 5, to complete the multiple beam semiconductor laser device.

The same advantages are achieved in the multiple beam semiconductor laser device as are achieved in the invention as described with respect to the first and second embodiments. When the active layers are superlattice layers, a dopant is diffused into the active layers of the respective semiconductor lasers over a controlled area to a controlled extent to disorder a part of each of the active layers adjacent the respective front and rear surfaces to reduce light absorption. The presence of the window layers 19 with increased band gap energies also reduces light absorption, permitting the multiple beam semiconductor laser device to operate at a higher output power than conventional semiconductor lasers.

In the foregoing description, the exemplary etchant employed for the self-limiting etching step forming laser facet surfaces is a mixture of sulfuric acid, hydrogen peroxide, and water. As one alternative etchant, a solution of tartaric acid and hydrogen peroxide may be used and still other etchants may be employed so long as they produce a relatively slow etching speed on the A and/or B faces of {111} planes of the semiconductor materials employed in the laser.

Although the embodiments described employ n-type GaAs as a substrate, semiconductor lasers within the scope of the invention may employ p-type GaAs substrates, provided the conductivity types of the other layers are inverted. Other materials in addition to AlGaAs and AlGaInP may be employed in semiconductor lasers according to the invention.

The surface of the semiconductor laser through which light is emitted in embodiments of the invention may be in any {111} plane including either of the A or B faces.

The invention has been described with certain preferred embodiments. Various modifications and additions within the spirit of the invention will occur to those of skill in the art. Accordingly, the invention is limited solely by the following claims.

We claim:

1. A semiconductor laser comprising:
    a compound semiconductor substrate having a surface in a {211} plane of the semiconductor substrate;
    crystalline semiconductor layers including a first cladding layer, an active layer, and a second cladding layer successively disposed on the surface of the semiconductor substrate and including first and second window surfaces transverse to the surface of the semiconductor substrate and in {111} planes;
    a doped crystalline semiconductor window layer disposed on the window surfaces; and
    electrodes respectively disposed on the crystalline layers and the semiconductor substrate.

2. The semiconductor laser of claim 1 wherein the active layer has a superlattice structure that is disordered adjacent the window layer.

3. The semiconductor laser of claim 1 wherein the active layer has a first band gap energy and the window layer has a second band gap energy larger than the first band gap energy.

4. The semiconductor laser of claim 1 wherein the active layer is selected from the group consisting of GaInP and AlGaInP and the first and second cladding layers are AlGaInP.

5. The semiconductor laser of claim 1 wherein the active layer is selected from the group consisting of GaAs and AlGaAs and the first and second cladding layers are AlGaAs.

6. The semiconductor laser of claim 1 wherein the window layer is selected from the group consisting of AlGaInP and AlGaAs.

7. A multiple beam semiconductor laser device comprising:
- a compound semiconductor substrate having a surface in a {211} plane of the semiconductor substrate;
- crystalline semiconductor layers including a first cladding layer, an active layer, and a second cladding layer successively disposed on the surface of the semiconductor substrate, including first and second window surfaces transverse to the surface of the semiconductor substrate and in a {111} planes, and a plurality of grooves transverse to the semiconductor substrate surface and to the window surfaces whereby multiple semiconductor lasers are formed;
- a doped crystalline semiconductor window layer disposed on the window surfaces; and
- electrodes disposed on the respective semiconductor lasers and on the semiconductor substrate.

8. The semiconductor laser device of claim 7 wherein the active layer includes a superlattice structure that is disordered adjacent the respective window layers.

9. The semiconductor laser device of claim 7 wherein the active layer has a first band gap energy and the window layers have a second band gap energy larger than the first band gap energy.

10. The semiconductor laser device of claim 7 wherein the active layer is selected from the group consisting of GaInP and AlGaInP and the first and second cladding layers are AlGaInP.

11. The semiconductor laser of claim 7 wherein the active layer is selected from the group consisting of GaAs and AlGaAs and the first and second cladding layers are AlGaAs.

12. The semiconductor laser of claim 7 wherein the window layers are selected from the group consisting of AlGaInP and AlGaAs.

* * * * *